United States Patent [19]

Aydil et al.

[11] Patent Number: 5,413,954
[45] Date of Patent: May 9, 1995

[54] METHOD OF MAKING A SILICON-BASED DEVICE COMPRISING SURFACE PLASMA CLEANING

[75] Inventors: Eray S. Aydil, Goleta, Calif.; Richard A. Gottscho, Maplewood, N.J.; Zhen-Hong Zhou, Bronx, N.Y.

[73] Assignee: AT&T Bell Laboratories, Murray Hill, N.J.

[21] Appl. No.: 973,900

[22] Filed: Nov. 10, 1992

[51] Int. Cl.[6] ............................................. H01L 21/20
[52] U.S. Cl. ..................... 437/81; 437/937; 437/946; 148/DIG. 17; 134/1
[58] Field of Search ................. 437/937, 946, 939, 81; 148/DIG. 17; 134/1

[56] References Cited

U.S. PATENT DOCUMENTS

| | | | |
|---|---|---|---|
| 5,261,965 | 11/1993 | Moslehi | 134/1 |
| 5,282,899 | 2/1994 | Balmashnov et al. | 118/723 R |
| 5,284,544 | 2/1994 | Mizutani et al. | 156/643 X |
| 5,292,370 | 3/1994 | Tsai et al. | 156/345 X |

FOREIGN PATENT DOCUMENTS 4-127529 4/1992 Japan .

OTHER PUBLICATIONS

"An Optimized in Situ Argon Sputter Cleaning Process for Device Quality Low-Temperature (T<800° C.) Epitaxial Silicon: Bipolar Transistor and pn Junction Characterization", by W. R. Burger et al., *J. Appl. Phys.*, vol. 62(10, 15 Nov. 1987, pp. 4255–4268.

"Plasma Cleaned Si Analyzed in Situ by X-ray Photoelectron Spectroscopy, Secondary Ion Mass Spectrometry, and Actinometry", by M. Delfino, *J. Appl. Phys.*, vol. 71 (2), 15 Jan. 1992, pp. 1001–1009.

"Low-temperature in Situ Surface Cleaning of Oxide-patterned Wafers by Ar/H$_2$ Plasma Sputter", by T. Yew, *J. Appl. Phys.*, vol. 68 (9), 1 Nov. 1990, pp. 4681–4693.

*Primary Examiner*—R. Bruce Breneman
*Assistant Examiner*—Jonathan D. Baskin
*Attorney, Agent, or Firm*—Eugen E. Pacher

[57] ABSTRACT

A novel vapor phase Si cleaning process comprises simultaneous exposure of the Si surface to a flux of neutral atomic hydrogen and to a flux of ionized particles. The former flux is substantially derived from a plasma, typically a microwave plasma, that is spaced apart from a second plasma, typically a RF plasma, from which the ionized particles are derived. The novel method can be implemented at relatively low cost and facilitates adjustment of the ratio between the two fluxes to result in optimal removal of, e.g., native oxide from the surface.

7 Claims, 2 Drawing Sheets

METHOD OF MAKING A SILICON-BASED DEVICE COMPRISING SURFACE PLASMA CLEANING

FIELD OF THE INVENTION

This invention pertains to methods of making Si-based semiconductor devices. More particularly, it pertains to such methods that comprise plasma surface cleaning.

BACKGROUND OF THE INVENTION

Silicon-based device manufacture almost always involves epitaxial growth of Si-containing semiconductor material (typically Si, but not excluding $Ge_xSi_{1-x}$ and GaAs) on a single crystal Si substrate. A precondition for growth of high quality epitaxial material is cleanliness of the Si substrate surface on an atomic scale. Thus, Si surface cleaning is a critical process in the manufacture of Si-based semiconductor devices.

Currently, wet cleaning methods are commonly employed. However, "dry" (vapor phase) cleaning processes typically would be more easily integrated in a cluster tool environment and would permit cleaning of wafers with a patterned $SiO_2$ layer thereon. Thus, development of simple, low cost and effective vapor phase cleaning processes for Si is of considerable interest to the industry. This application discloses such a process, capable of implementation at relatively low cost.

There are numerous disclosures of vapor phase cleaning processes for Si in the literature. Among these are several that deal with plasma cleaning techniques. See, for instance, W. R. Burger et al., *J. Applied Physics*, Vol. 62, p. 4255 (1987); M. Delfino et al., *J Applied Physics*, Vol. 71, p. 1001 (1992); and T. R. Yew et al., *J. Applied Physics*, Vol. 68, p. 4681 (1990). However, none of the disclosed plasma techniques are free of disadvantages.

For instance, the Ar plasma sputter cleaning process described by Burger et al. typically results in a heavily dislocated epitaxial layer unless a high-temperature anneal precedes the epitaxial growth. The Delfino et al. paper discloses Si cleaning by means of a $H_2$ plasma. More specifically, it discloses an electron cyclotron resonance (ECR) $H_2$ plasma cleaning process. The process involves formation of a microwave plasma in proximity to a Si wafer on an electrode that is capacitively coupled to a RF power supply. The process requires relatively costly equipment, including vacuum pumps capable of providing a relatively low operating pressure (e.g., $1 \times 10^{-3}$ Torr). The Yew et al. paper discloses $Ar/H_2$ RF plasma sputter cleaning of oxide-patterned Si wafers in the temperature range 500°-800° C. The disclosed high temperatures limit the usefulness of this approach.

THE INVENTION

Figure 1:
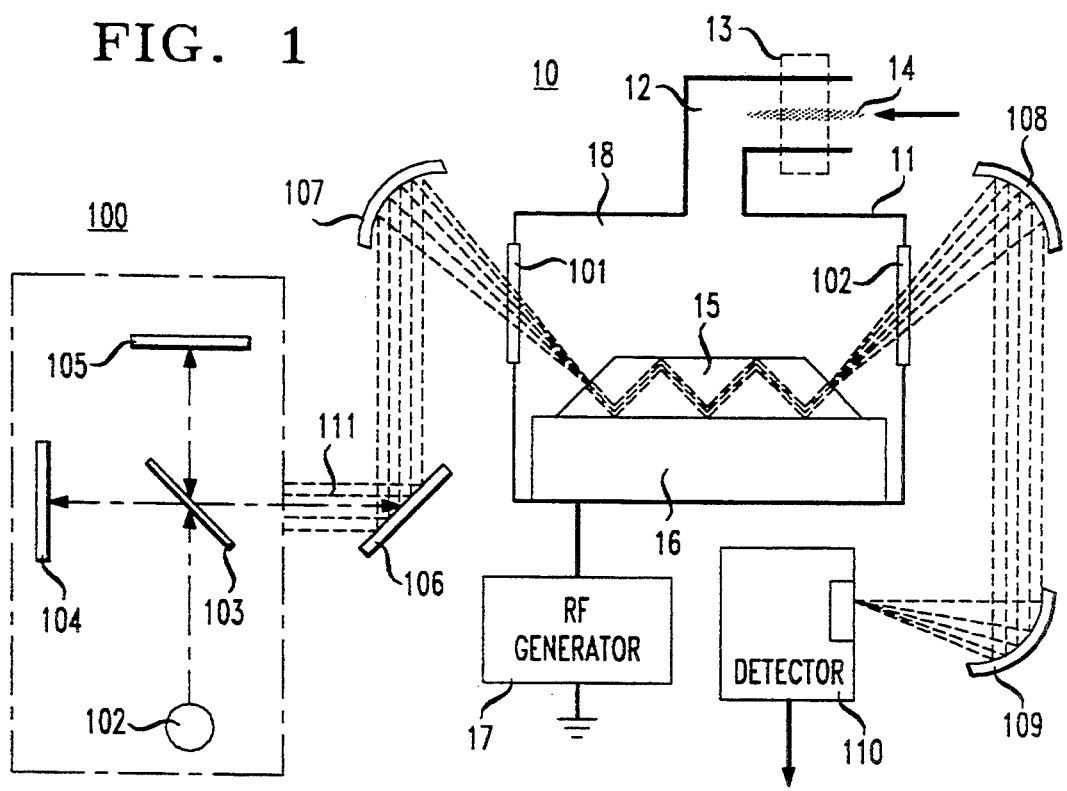
FIG. 1 schematically depicts exemplary apparatus for the practice of the invention.

Broadly speaking, the invention is embodied in a manufacturing process of Si-based devices that comprises a Si cleaning process that utilizes separate first and second plasmas. More specifically, we are disclosing a method of making a semiconductor device (e.g., a Si FET or, more typically, a Si integrated circuit) that involves the steps of providing a single crystal Si body (typically a wafer) having a major surface, cleaning the surface in an evacuable chamber, growing epitaxial semiconductor material (typically Si, but not excluding, for instance, $Ge_xSi_{1-x}$ or GaAs) on the surface, and carrying out one or more further steps (e.g., standard lithography, etching, dopant implantation, $SiO_2$ growth, metalization, dicing and/or packaging) towards completion of the device. Significantly, the cleaning step comprises exposing at least a portion of the surface simultaneously to a flux $\Gamma_n$ of neutral atomic hydrogen and to a flux $\Gamma_i$ of ionized particles, with $\Gamma_n$ substantially derived from a first plasma in a first plasma region and $\Gamma_i$ derived from a second plasma in a second plasma region that is spaced apart from the first plasma region. Associated with the flux of neutral atomic hydrogen is a neutral reaction rate $R_n$ that is equal to $v_n\Gamma_n$, where $v_n$ is the reaction probability per incident neutral hydrogen atom. Associated with the flux of ionized particles is an ion reaction rate $R_i$ that is equal to $\Gamma_i \cdot v_i \cdot \epsilon_i$, where $v_i$ is the reaction probability per ion energy and incident ion, and where $\epsilon_i$ is the ion energy. The ratio $R_n/R_i$ desirably is adjusted such that substantially all Si—O bonds (and C—H) are removed on the exposed portion of the surface without heating of the Si body above 350° C., and essentially without causing damage to the exposed portion of the surface. The temperature of the Si body preferably is less than 100° C., frequently about room temperature (~25° C.). The inventive method typically is practiced in an evacuable chamber in which the pressure is above about 0.1 Torr.

An aspect of the invention is our discovery that the outcome of Si cleaning by means of a H-containing plasma significantly depends on the ratio of $\Gamma_n/\Gamma_i$, or more specifically, the ratio $R_n/R_i$. Indeed, we believe that $R_n/R_i$ is a critical process parameter for cleaning of Si surfaces with native oxide thereon. We have found that typically Si—O bonds cannot be completely removed (at least at low temperatures, typically below about 350° C.) without ion bombardment, yet too high an ion energy flux damages the surface and promotes formation of H—SiO. Our findings imply that neither a conventional remote microwave plasma (which typically yields $R_n/R_i$ much greater than 1) nor a conventional RF discharge (which typically yields $R_n/R_i$ much less than 1) are effective in removing Si—O bonds unless the sample is heated above about 350° C. However, we have also found that a novel hybrid process that utilizes both a remote microwave plasma and a separate RF discharge can remove essentially all Si—O bonds even at low sample temperature (e.g., room temperature) without introduction of any significant damage. In such a hybrid process, the parameter $R_n/R_i$ typically can be readily varied, permitting ready process optimization for a given cleaning apparatus.

FIG. 1 schematically shows exemplary apparatus 10 for cleaning according to the invention. FIG. 1 also shows optional features that are not required for cleaning according to the invention but that may be useful for, e.g., process optimization and process end-point detection.

The cleaning apparatus comprises evacuable reactor chamber 11 which comprises gas inlet 12. During operation of the apparatus microwave cavity 13 can be energized, resulting in creation of microwave plasma 14. The gas inlet advantageously is configured such that there exists no line-of-sight particle trajectory from the microwave plasma region to sample 15, thereby ensuring that essentially only neutral particles can reach the sample from microwave plasma 14.

The sample is positioned on electrode 16. During operation of the apparatus a RF voltage can be applied to the electrode by means of RF generator 17, resulting in RF plasma 18 and incidence of a flux of ionized particles from the RF plasma on the sample. Conventional features such as vacuum pumps, pump connections to the chamber, and means for sample transfer to other reactor chambers are not shown. Optional windows 101 and 102 facilitate entrance into and exit from the chamber of infrared (IR) probe beam 111. A significant feature of the apparatus and of the inventive method is the existence of two spaced apart plasma regions, a microwave region and a RF plasma region. The former is the source of substantially all of the atomic hydrogen and the latter of the ionized particles, e.g., ionized hydrogen, nitrogen, argon, ammonia or other relatively inert particles.

FIG. 1 also schematically shows Fourier transform IR (FTIR) spectrometer 100, mirrors 106, 107, 108 and 109, and HgCdTe detector 110. IR source 102 provides an IR beam that is split by means of KBr beam splitter 103, with the split beams being reflected by fixed mirror 104, and moving mirror 105, respectively. The reflected beams are re-combined and reflected by beam splitter 103 to form probe beam 111. The probe beam is focused onto a beveled region of sample 15, makes multiple traverses of the sample, exits the sample at another beveled region, and is caused to be incident on detector 110. The detector output is provided to appropriate apparatus, e.g., a conventional PC data acquisition system, not shown. FTIR spectrometry, including real-time attenuated total internal reflection FTIR spectrometry of the type shown in FIG. 1, is a known technique that does not require further elaboration.

Figure 2:
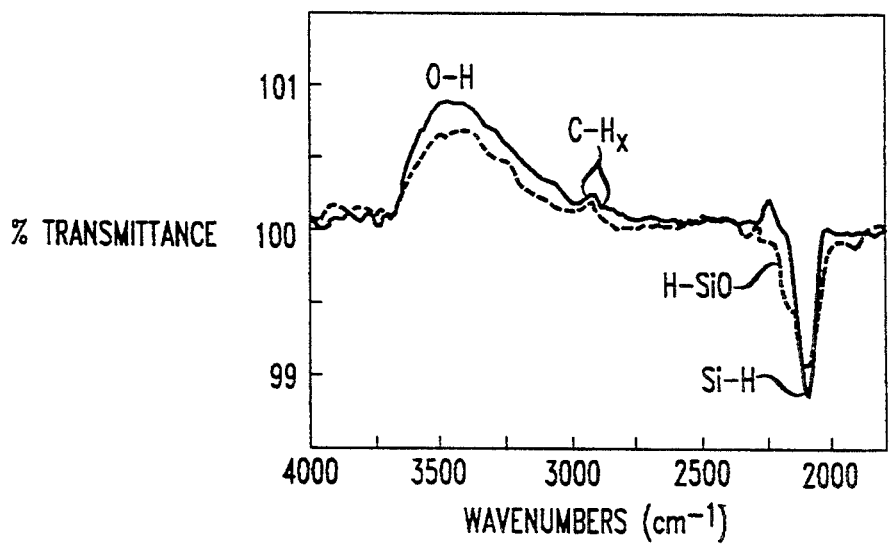
FIGS. 2-4 show transmittance spectra obtained from Si samples by means of the apparatus of FIG. 1.

FIG. 2 shows data obtained with apparatus substantially as shown in FIG. 1. The microwave cavity was driven by a Microtron 200 generator, the RF power was generated using an ENI Model 350L RF power amplifier with a Tektronix TM 503 wave function generator, the gas flow was regulated by means of a MKS 1259B mass flow controller. The gas can be $H_2$, a H-containing gas such as $NH_3$, or a hydrogen-containing mixture of such a gas and inert gas such as $N_2$, Ar, or He.

Figure 3:
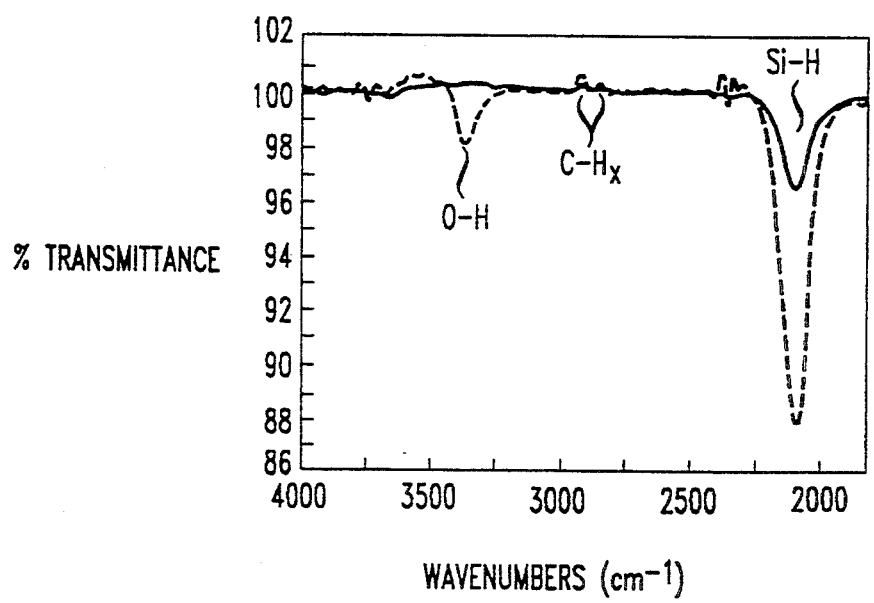
Figure 4:
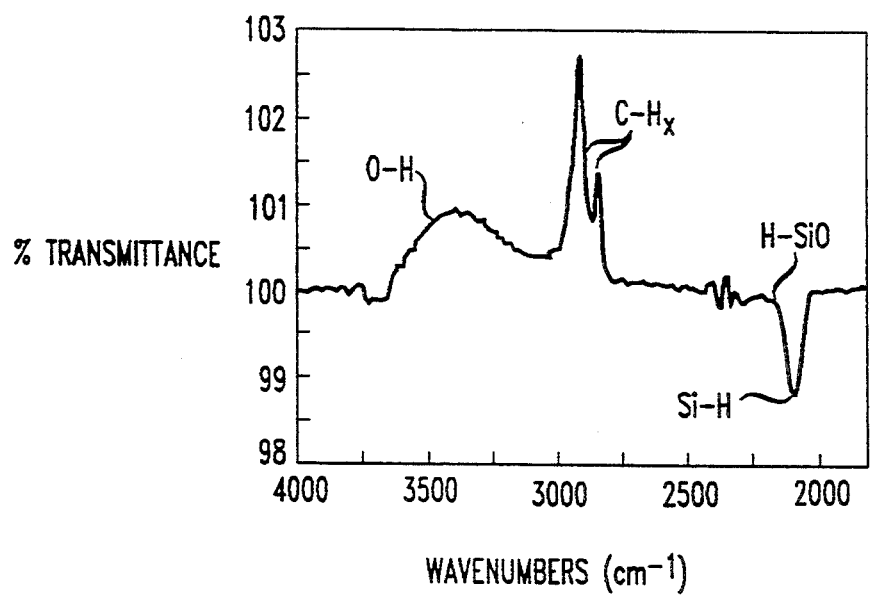

The data of FIGS. 2-4 are presented in the differential mode, with the spectrum obtained from a cleaned sample being normalized to the spectrum of an uncleaned comparison sample. An increase in transmittance indicates bond removal, whereas a decrease indicates bond formation. The dash line in FIG. 2 was obtained under conditions (gas flow 10 sccm $H_2$, microwave power 140 W, RF power 10 W, pressure 1 Torr) that yielded $R_n/R_i$ below the optimal value. Although oxide was removed, H—SiO was formed. Appropriate change of the conditions (RF power 3 W, $H_2$ flow rate 50 sccm, other parameters unchanged) resulted in increased $R_n/R_i$, sufficient to result in removal of all H—SiO and formation of Si—H, as indicated by the solid line in FIG. 2. Those skilled in the art will recognize that saturation of the Si surface with Si—H bonds is a desirable feature. Existence of this feature was verified, since continued exposure under the indicated conditions did not increase the area under the Si—H peak at 2100 $cm^{-1}$. Attainment of constant area under the Si—H peak can advantageously serve as end-point indication in a Si cleaning process. The conditions under which the solid line spectrum of FIG. 2 was obtained resulted, in the given apparatus, in essentially optimal $R_n/R_i$, and therefore in essentially optimal cleaning. Of course, optimal conditions will typically be apparatus specific, thus no generally valid limits on operating parameters can be provided. Furthermore, the numerical value of $R_n/R_i$ that corresponds to optimal cleaning in a given apparatus is difficult to ascertain. However, knowledge of the numerical value of $R_n/R_i$ is not necessary for the practice of the invention, since those skilled in the art will be readily able, based on our teachings herein, to determine the specific operating conditions that are appropriate for the practice of the invention in any given apparatus. Such optimization typically will require only a minor amount of experimentation and can be even further speeded by the (optional) use of FTIR spectrometry of the type described above.

The spectra of FIG. 3 were obtained under conditions that resulted in $R_n/R_i$ below the optimal value. The solid line resulted when the gas flow was 10 sccm $H_2$, microwave power 140 W, RF power 20 W, and pressure 1 Torr, and the dash line when the gas flow was 10 sccm $NH_3$, 140 W microwave power, 50 W RF power, pressure 2 Torr. Under both conditions the Si—H peaks were too large to be attributable to Si—H surface bonds alone. We currently believe that under the conditions used to obtain the spectra of FIG. 3 (resulting in $R_n/R_i << 1$), a significant portion of the Si surface atoms are displaced and dangling bonds are created. The resulting damaged Si layer will typically react with H atoms to form surface and sub-surface Si—H bonds, giving rise to the observed large Si—H peak.

Based on these observations, we believe that in general a RF hydrogen-containing plasma alone cannot produce an undamaged, optimally H-terminated Si surface, as required for optimal subsequent epitaxial growth. For instance, we have observed that, in the apparatus used by us, even the RF power required merely to sustain the RF plasma results in excessive ion bombardment and damages the surface. The absence of surface damage can be established not only by means of FTIR spectroscopy as described herein, but also by other known techniques such as X-ray photo-electron spectroscopy, Rutherford backscattering spectroscopy, and deep level transient spectroscopy.

FIG. 4 demonstrates that, by means of a treatment according to the invention (140 W microwave power, 3 Watt RF power, 50 sccm $H_2$, 2 Torr), not only native oxide but also hydrocarbons can be removed from a Si body at low temperature (below 350° C., e.g., at room temperature). Our results indicate that, under conditions that are appropriate for native oxide removal, hydrocarbons are removed even faster than the oxide. FTIR can also be used to detect the hydrocarbon removal endpoint, in analogous manner to oxide removal endpoint detection. In both cases, when the corresponding peak in the FTIR spectrum has become constant, i.e., independent of plasma exposure time, then the surface is free of the respective species, to within the resolution of the technique, e.g., to within <1% of a monolayer.

We claim:

1. A method of making a semiconductor device comprising
   a) providing a single crystal Si body having a major surface with which are associated Si—O bonds;

b) cleaning said major surface in an evacuable chamber;

c) growing epitaxial semiconductor material on the major surface; and characterized in that step b) comprises d) exposing at least a portion of the surface simultaneously to a flux $\Gamma_n$ of neutral atomic hydrogen and to a flux $\Gamma_i$ of ionized particles, with $\Gamma_n$ derived from a first plasma in a first plasma region and $\Gamma_i$ derived from a second plasma in a second plasma region that is spaced apart from the first plasma region.

2. Method according to claim 1, wherein the first plasma is a microwave plasma, and the evacuable chamber is configured such that there exists no line-of-sight path between the first plasma region and the Si body.

3. Method according to claim 1, wherein associated with the flux of neutral atomic hydrogen is a neutral reaction rate $R_n$ that is equal to $\Gamma_n \cdot \nu_n$, where $\nu_n$ is the reaction probability per incident neutral hydrogen atom, and associated with the flux of ionized particles is an ion reaction rate $R_i$ that is equal to $\Gamma_i \cdot \nu_i \cdot \epsilon_i$, where $\nu_i$ is the reaction probability per ion energy and incident ion, and where $\epsilon_i$ is the ion energy, and wherein the method comprises adjusting the ratio $R_n/R_i$ such that substantially all Si—O bonds are removed on the exposed portion of the surface, essentially without damage to the exposed portion of the surface and without heating the Si body to 350° C. or above.

4. Method according to claim 1, wherein a hydrogen-containing feed gas is caused to flow into said evacuable chamber.

5. Method according to claim 4, wherein the feed gas comprises $H_2$, $NH_3$ or a mixture of $H_2$ and $NH_3$.

6. Method of claim 5, wherein the feed gas further comprises an inert gas selected from the group consisting of $N_2$, He and Ar.

7. Method of claim 4, wherein during at least a part of the cleaning step the pressure in said evacuable chamber is greater than 0.1 Torr and the temperature of the Si body is less than 150° C.

* * * * *